United States Patent
Kim et al.

(10) Patent No.: US 8,698,134 B2
(45) Date of Patent: Apr. 15, 2014

(54) ORGANIC LIGHT EMITTING DISPLAY DEVICE AND METHOD OF FABRICATING THE SAME

(71) Applicant: LG Display Co., Ltd., Seoul (KR)

(72) Inventors: Byungsoo Kim, Seoul (KR); Kyull Han, Gyeongsangbuk-Do (KR); SangDae Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/723,689

(22) Filed: Dec. 21, 2012

(65) Prior Publication Data

US 2014/0061598 A1    Mar. 6, 2014

(30) Foreign Application Priority Data

Aug. 31, 2012   (KR) .................. 10-2012-0096724

(51) Int. Cl.
*H01L 51/00*   (2006.01)

(52) U.S. Cl.
USPC .......... 257/40; 257/59; 257/72; 257/E33.063; 438/34

(58) Field of Classification Search
USPC .............. 257/59, 72, 40, E33.063; 438/34
See application file for complete search history.

(56) References Cited

U.S. PATENT DOCUMENTS 8,179,035 B2 *   5/2012   Spindler et al. ............... 313/504

* cited by examiner

*Primary Examiner* — Tu-Tu Ho (74) *Attorney, Agent, or Firm* — Morgan, Lewis & Bockius LLP (57) ABSTRACT

Disclosed is an organic light emitting display device including: a first substrate including a plurality of pixel regions; a thin film transistor (TFT) formed in each of the plurality of pixel regions of a display unit of the substrate; a first electrode formed in the pixel region of the display unit; an organic light emitting unit formed in the pixel region of the display unit to emit light; a second electrode formed on the organic light emitting unit of the display unit; a passivation layer formed on the second electrode; and a second substrate formed on the passivation layer, wherein the second electrode is made of an alloy of silver (Ag) and an alkaline earth metal or an alloy of silver (Ag) and a rare earth metal, a composition ratio of the silver (Ag) and the alkaline earth metal or the rare earth metal is (more than 1):1, and a thickness of the second electrode ranges from 200 Å to 350-400 Å.

13 Claims, 5 Drawing Sheets

ORGANIC LIGHT EMITTING DISPLAY DEVICE AND METHOD OF FABRICATING THE SAME

CROSS-REFERENCE TO RELATED APPLICATION

Pursuant to 35 U.S.C. §119(a), this application claims the benefit of earlier filing date and right of priority to Korean Application No. 10-2012-0096724, filed on Aug. 31, 2012, the contents of which is incorporated by reference herein in its entirety.

BACKGROUND OF THE INVENTION

1. Field of the Invention

The present disclosure relates to an organic light emitting display device and a method of fabricating the same, and particularly, to an organic light emitting display device having a simple structure and reducing fabrication costs, and a method of fabricating the same.

2. Background of the Invention

Recently, various flat panel display devices capable of reducing weight and volume as shortcomings of cathode ray tubes have been developed. Such flat panel display devices include a liquid crystal display device, a field emission display device, a plasma display panel, an organic light emitting display device, etc.

Among the flat panel display devices, a plasma display has a simple structure and fabrication process, is light, thin, short, and small, and most advantageous for a large screen, and thus, it receives much attention, and it has low luminous efficiency and luminance and much power consumption. Compared to the plasma display, a liquid crystal display device uses a semiconductor process, so it is difficult to have a large screen and consumes much power due to a backlight unit. Also, a liquid crystal display makes a great light loss due to optical elements such as a polarization filter, a prism sheet, a diffusion plate, or the like, and has a narrow viewing angle.

Compared to the liquid crystal display, an organic light emitting display device is divided into an inorganic light emitting display device and an organic light emitting display device. The light emitting display device is a self-luminous device and has advantages in that it has fast response speed and high luminous efficiency and luminance, and wide viewing angle. Compared to an organic light emitting display device, an inorganic light emitting display device has high power consumption, cannot obtain high luminance, and cannot emit various colors of light. Meanwhile, an organic light emitting display device is driven with a DC voltage as low as tens of volts, has a fast response speed, obtains high luminance, and emits various colors of light such as R, G, and B, and thus, currently, it is actively researched.

However, the organic light emitting display device has the following problems. In general, it is widely known that an organic light emitting material forming an organic light emitting layer is vulnerable to moisture. That is, when moisture infiltrates into an organic light emitting layer of the organic light emitting display device, luminous efficiency of the organic light emitting material is degraded to cause a fatal defective organic light emitting display device.

In order to prevent infiltration of moisture, an anti-moisture insulating layer is formed. A conventional art organic light emitting display device including an anti-moisture insulating layer will be described briefly as follows.

Figure 1:
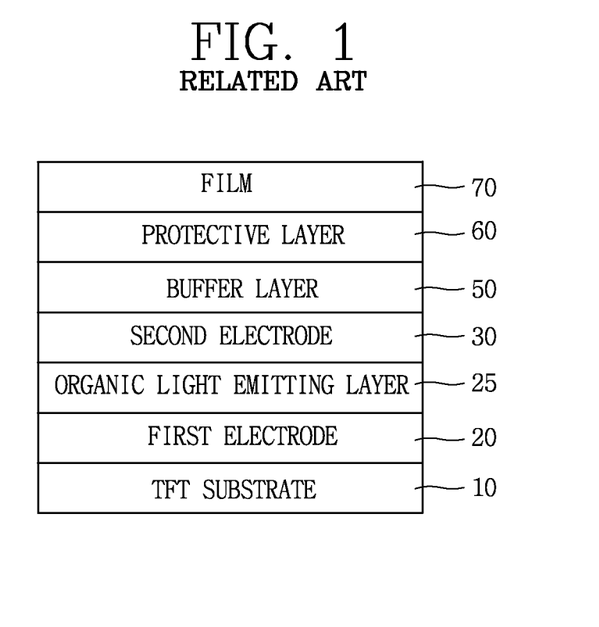
FIG. 1 illustrates a view schematically depicting a structure of a conventional organic light emitting display device.

FIG. 1 is a view schematically shown a structure of a conventional art organic light emitting display device.

As shown in FIG. 1, the conventional art organic light emitting display device is a top emission display device and includes a substrate 10 on which a thin film transistor (TFT) and various wirings are formed, a first electrode 20 formed on the substrate 10, an organic light emitting layer 25 formed on the first electrode 20, a second electrode 30 formed on the organic light emitting layer 25, a buffer layer 50 formed on the second electrode 30, a passivation layer 60 formed on the buffer layer 50, and a protective film 70 attached to the passivation layer 60.

The substrate 10 is a glass substrate, and a thin film transistor, and the like, is formed on the glass substrate. The first electrode 20 is an anode, and the second electrode 30 is a cathode. Thus, electrons are injected from the second electrode 30 to the organic light emitting layer 25 and holes are injected from the first electrode 20 to the organic light emitting layer 25 to form excitons in the organic light emitting layer. As the excitons decay, light corresponding to an energy difference of lowest unoccupied molecular orbital (LUMO) and highest occupied molecular orbital (HOMO) of the light emitting layer is generated and output to the outside (an upward direction of the second electrode 30 in the drawing).

The buffer layer 50 and the passivation layer 60 are provided above the second electrode 30. The passivation layer 60 is a layer for blocking infiltration of moisture into the organic light emitting layer 25 from the outside, and the buffer layer 50 prevents the second electrode 30 from being damaged to cause a defect when the passivation layer 60 is formed.

In general, the passivation layer 60 is made of an inorganic material and formed through chemical vapor deposition (CVD) or plasma enhanced chemical vapor deposition (PECVD). Among the processes, the CVD process is performed at a high temperature, so the second electrode 30 is affected by the high temperature during the process, causing a defect. Also, during the PECVD process, plasma particles having high energy collide with the second electrode 30 to damage the second electrode 30, causing a defective product.

The buffer layer 50 is formed to prevent the second electrode 30 from being defective during a process of forming the passivation layer 60. The buffer layer 50 is made of a high-priced organic material such as CuPc (copperpthalocyanine), PTCDA (3,4,9,10-perylenetetracarboxylic dianhydride), BCP (Li-doped 2,9-dimethyl-4,7-diphenyl-1,10-phenanthroline), and thus, when the buffer layer 50 is formed, fabrication costs are increased, and because an additional buffer layer formation process is required, the fabrication process is complicated.

SUMMARY OF THE INVENTION

Therefore, an aspect of the detailed description is to provide an organic light emitting display device in which an electrode on an organic light emitting unit is made of an ally of silver (Ag) and an alkaline earth metal or an alloy of silver (Ag) and a rare earth metal having a composition ratio of (more than 1):1 to eliminate an additional organic buffer layer between the electrode and a passivation layer, thereby reducing fabrication costs and simplifying a fabrication process, and a method of fabrication thereof.

To achieve these and other advantages and in accordance with the purpose of this specification, as embodied and broadly described herein, an organic light emitting display device includes: a first substrate including a plurality of pixel regions; a thin film transistor (TFT) in each of the pixel regions of a display unit on first substrate; a first electrode in the pixel region of the display unit; an organic light emitting unit in the pixel region of the display unit to emit light; a second electrode on the organic light emitting unit of the display unit; a passivation layer formed on the second electrode; and a second substrate on the passivation layer, wherein the second electrode is made of an alloy of silver (Ag) and an alkaline earth metal or an alloy of silver (Ag) and a rare earth metal, a composition ratio of the silver (Ag) and the alkaline earth metal or the ratio of the silver (Ag) and the rare earth metal is (more than 1):1, and a thickness of the second electrode ranges from 200 Å to 350-400 Å.

The passivation layer may include: a first passivation layer made of an inorganic material and disposed on the second electrode; a second passivation layer made of an organic material and disposed on the first passivation layer; and a third passivation layer made of an inorganic material and disposed on the second passivation layer. The first passivation layer and the second passivation layer may be made of SiNx or SiOx, and the second passivation layer may be made of a polymer-based material. In this case, a refractive index of the second electrode may be 0.1 to 0.4, and a refractive index of the first passivation layer may be 1.5 to 2.5

A method of fabricating an organic light emitting display device, includes: providing a first substrate and a second substrate; forming a thin film transistor (TFT) at each pixel of the first substrate; forming a first electrode in each pixel; forming an organic light emitting unit for emitting light on the first electrode; forming a second electrode by depositing an alloy of silver (Ag) and an alkaline earth metal or an alloy of silver (Ag) and a rare earth metal having a composition ratio of (more than 1):1 and having a thickness ranging from 200 Å to 350-400 Å; forming a passivation layer on the second electrode; and attaching the first substrate and the second substrate.

A cathode may be made of an alloy of silver (Ag) and an alkaline earth metal or an alloy of silver (Ag) and a rare earth metal, the content of silver (Ag) may be greater than the content of alkaline earth metal or rare earth metal, and the cathode may have a thickness ranging from 200 Å to 350-400 Å, whereby when a passivation layer is formed, the cathode is prevented from being damaged by heat or plasma particles having high energy even without a buffer layer.

Thus, because there is no need to form a high-priced buffer layer, fabrication costs can be reduced, and because a buffer layer formation process is omitted, the process can be simplified and a tack time of the organic light emitting display device can be minimized to improve process efficiency.

Also, because a refractive index of the cathode is 0.1 to 0.4 and a refractive index of the first passivation layer directly in contact with the cathode is set to be about 1.5 to 2.5, whereby light emitted from the organic light emitting layer is prevented from being refracted from an interface between the cathode and the first passivation layer, and thus, a degradation of picture quality can be prevented.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

The present invention provides an organic light emitting display device for reducing fabrication costs and simplifying a fabrication process by eliminating a high-priced organic buffer layer. That is, in an embodiment of the present invention, a generation of a defective cathode in forming a passivation layer can be prevented by adjusting a composition and a thickness of a material forming the cathode formed under the passivation layer.

Figure 2:
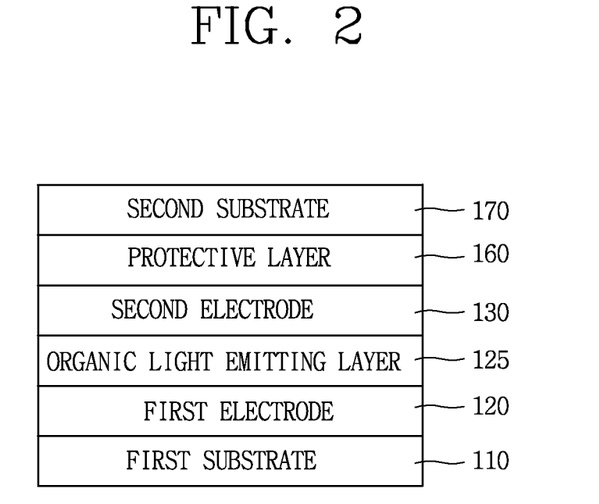
FIG. 2 illustrates a view schematically depicting a structure of an organic light emitting display device according to an embodiment of the present invention.

FIG. 2 illustrates a view conceptually depicting a structure of an organic light emitting display device according to an embodiment of the present invention. The organic light emitting display device illustrated in FIG. 2 is a top emission display device.

As shown in FIG. 2, the organic light emitting display device according to an embodiment of the present invention includes a first substrate 110 having a thin film transistor, or the like, formed thereon, a first electrode 120 formed on the first substrate, an organic light emitting unit 125 formed on the first electrode 120, a second electrode 130 formed on the organic light emitting layer; a passivation layer 160 formed on the second electrode 130, and a second substrate 170 formed on the passivation layer 160.

The first substrate 110 is formed of a flexible substrate such as a transparent material such as glass or transparent plastic. Although not shown, various wirings such as a gate line, a data line, or the like, are formed on the first substrate 110.

The first electrode 120 as an anode is made of a metal having a low work function and good reflectance such as silver (Ag) or aluminum (Al) alloy, and the second electrode 130 as a cathode is made of a metal compound obtained by mixing an alkaline earth metal or a rare earth metal in silver (Ag).

The passivation layer 160 is formed as a plurality of layers made of an inorganic material and an organic material and prevents infiltration of moisture and a foreign material into the organic light emitting unit 125 from the outside. The inorganic passivation layer is made of an inorganic material such as SiNx, SiOx, or the like, and the inorganic layer is made of a polymer-based organic material.

The second substrate 170 may be formed as a transparent substrate such as glass or plastic, and may be formed of a PS (Polystyrene) film, a PE (Polyethylene) film, a PEN (Polyethylene Naphthalate) film, a PI (Polyimide) film, or the like.

Such a protective film is an encapsulation cap covering the organic light emitting display device, so it may also be called a cover film.

In the organic light emitting display device having the foregoing configuration, electrons are injected from the second electrode 130 to the light emitting layer of the organic light emitting unit 125, and holes are injected from the first electrode 110 to the organic light emitting layer to form excitions in the organic light emitting layer. As the excitons decay, light corresponding to an energy difference of lowest unoccupied molecular orbital (LUMO) and highest occupied molecular orbital (HOMO) of the light emitting layer is generated and output in an upward direction (or front surface).

Here, a portion of light emitted from the organic light emitting unit 125 is output in the upward direction (or the front surface) through the second electrode 130 as a translucent electrode, and a portion of light is reflected from the second electrode 130 and reflected again from the first electrode 120 so as to be output to the outside through the second electrode 130. Thus, because light is amplified between the first electrode 120 and the second electrode 130 and output to the outside, luminous efficiency is improved.

Here, the second electrode 130 is made of Ag:alkaline earth metal or rare earth metal=1 or greater:1. That is, the content of Ag is greater than the content of the alkaline earth metal or the rare earth metal. Also, preferably, transmittance of the material of the second electrode 130 is 25% at a wavelength of 460 nm, 20% at a wavelength of 530 nm, and 15% or greater at a wavelength of 620 nm.

In general, in a top emission organic light emitting display device, a cathode is formed to have a thickness of 150 Å or smaller. However, in an embodiment of the present invention, the cathode is formed to have a thickness ranging from 200 Å to 350-400 Å. Also, the content of Ag is greater than the content of the alkaline earth metal or rare earth metal.

Thus, in an embodiment of the present invention, because the cathode is formed to have a thickness of 200 Å or greater and the content of Ag is greater than the content of the alkaline earth metal or the rare earth metal in the ratio of the alloy of the cathode, the cathode is prevented from being damaged by high temperature heat or plasma particles having high energy in forming the passivation layer according to a CVD or a PECVD method on the cathode 130. Thus, there is no need to additionally form a high-priced buffer layer to reduce fabrication costs and simplify a fabrication process.

Hereinafter, a detailed structure of the organic light emitting display device according to an embodiment of the present invention will be described.

Figure 3:
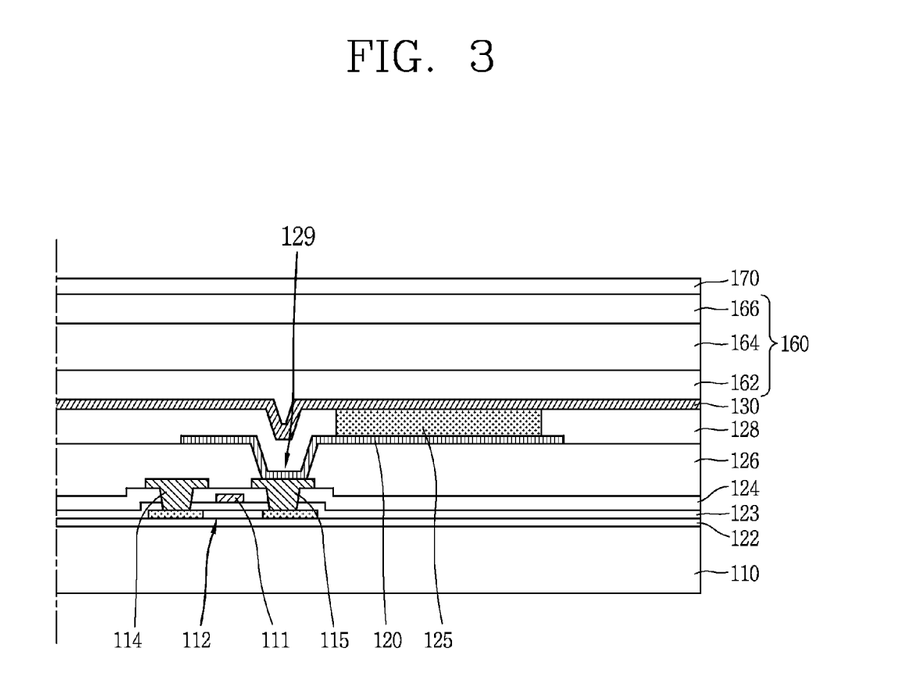
FIG. 3 illustrates a cross-sectional view depicting in detail a structure of the organic light emitting display device according to an embodiment of the present invention.

FIG. 3 illustrates a cross-sectional view depicting an actual structure of the organic light emitting display device 101 according to an embodiment of the present invention.

As shown in FIG. 3, a driving thin film transistor (TFT) made of a transparent material such as glass or plastic. Although not shown, a plurality of pixel regions are formed on the first substrate 110, and the driving TFT formed in each pixel region includes a buffer layer 122 formed on the substrate 110, a semiconductor layer 112 formed in R, G, and B pixel regions on the buffer layer 122, a first insulating layer 123 formed on the entire substrate 110 on which the semiconductor layer 112 is formed, a gate electrode 111 formed on the first insulating layer 123, a second insulating layer 124 formed on the entire substrate 110 to cover the gate electrode 111, and a source electrode 114 and a drain electrode 115 in contact with the semiconductor layer 112 through contact holes formed in the first insulating layer 123 and the second insulating layer 124.

The buffer layer 122 may be formed as a single layer or a plurality of layers. The semiconductor layer 112 may be formed of a transparent oxide semiconductor such as crystalline silicon or an indium gallium zinc oxide (IGZO) and includes a channel layer in a central region and doping layers at both sides thereof, and the source electrode 114 and the drain electrode 115 are in contact with the doping layers.

The gate electrode 111 may be made of a metal such as Cr, Mo, Ta, Cu, Ti, Al, an Al alloy, or the like, and the first insulating layer 123 and the second insulating layer 124 may be formed as a single layer made of an inorganic insulating material such as $SiO_2$ or SiNx or as a dual-layer including $SiO_2$ and SiNx. Also, the source electrode 114 and the drain electrode 115 may be made of Cr, Mo, Ta, Cu, Ti, Al, or an Al alloy.

A third insulating layer 126 is formed on the substrate 110 on which the driving TFT is formed. The third insulating layer 126 may be made of an inorganic insulating material such as $SiO_2$.

Although not shown, an overcoat layer for planarizing the substrate 110 may be formed on the third insulating layer 126.

A contact hole 129 is formed in the third insulating layer 126, and the first electrode 120 is formed on the third insulating layer 126 and electrically connected with the drain electrode 115 of the driving TFT through the contact hole 129.

The first electrode 120 is made of a metal having good reflectance such as Ag, and a signal is applied to the first electrode 120 through the driving TFT. The first electrode 120 reflects light emitted from the organic light emitting unit upwardly to improve luminous efficiency of the organic light emitting display device. The first electrode may be made of a metal having a low work function, good conductivity, and good reflectance, such as Al or an Al alloy.

A bank layer 128 is formed in the boundary of each pixel region on the third insulating layer 126. The bank layer 128 is a sort of partition to prevent light beams having particular colors output from the adjacent pixel regions from being mixed and output. Also, because the bank layer 128 fills a portion of the contact hole 129, it can reduce a step, and as a result, a generation of a defect in the organic light emitting unit due to an excessive step can be prevented in forming the organic light emitting unit.

The organic light emitting unit 125 is formed on the first electrode 120 and the bank layer 128. The organic light emitting unit 125 is formed on the first electrode 120 between the bank layers 128. The organic light emitting unit 125 includes an R-organic light emitting layer emitting red light, a G-organic light emitting layer emitting green light, and a B-organic light emitting layer emitting blue light. Although not shown, the organic light emitting layer may include an electron injection layer and a hole injection layer for injecting electrons and holes to the organic light emitting layer, respectively, and an electron transport layer and a hole transport layer for transporting injected electrons and holes to the organic light emitting layer, respectively, besides the organic light emitting layer.

Also, the organic light emitting layer may include a plurality of organic light emitting layers. In this case, a charge generation layer for supplying charges to each organic light emitting layer is disposed between the organic light emitting layers. For example, when two organic light emitting layers are formed, only one charge generation layer is disposed between two organic light emitting layers, and when three organic light emitting layers are formed, two charge generation layers are formed between the respective organic light emitting layers.

Here, the electron injection layer, the electron transport layer, the hole transport layer, and the hole injection layer are formed in the periphery of the plurality of organic light emitting layers, rather than between the plurality of organic light emitting layers. For example, the organic light emitting unit is formed in order of the electrode injection layer, the electrode transport layer, the first organic light emitting layer, the charge generation layer, the second organic light emitting layer, the hole transport layer, and the hole injection layer.

Thus, because the plurality of organic light emitting layers are formed, charges are smoothly injected between the organic light emitting layers to improve luminous efficiency of the organic light emitting layers.

Here, the charge generation layer may include an n-type charge generation layer generating n-type charges and a p-type charge generation layer generating p-type charges.

Also, the organic light emitting layer may be formed as a white organic light emitting layer emitting white light. In this case, R, G, and B color filter layers are formed under the white organic light emitting layer, for example, in R, G, and B subpixel regions on the insulating layer 125 in order to convert white light emitted from the white organic light emitting layer into red light, green light, and blue light. The white organic light emitting layer may be formed by mixing a plurality of organic materials emitting monochromatic light or R, G, and B, or by stacking a plurality of organic light emitting layers each emitting monochromatic light of R, G, and B.

The second electrode 130 is formed on the entire first substrate 110 on the organic light emitting unit 125. The second electrode 130 is formed by stacking an alloy obtained by mixing Ag and alkaline earth metal such as Mg, Ca, or the like, or an alloy obtained by mixing Ag and a rare earth metal such as Ga, Li, or the like, through sputtering, or the like.

Here, a mixture ratio between Ag and the alkaline earth metal or a composition ratio between Ag and the rare earth metal is (more than 1):1, so the content of Ag is greater than the content of the alkaline earth metal or the rare earth metal. Also, the second electrode 130 is formed to have a thickness ranging from 200 Å to 350-400 Å.

Of course, the second electrode 130 may be formed to have a thickness smaller than 200 Å or greater than 350-400 Å. However, when the second electrode 130 has a thickness smaller than 200 Å, the second electrode 130 is affected by a CVD or a PECVD process for forming the upper passivation layer to generate a defect, and when the second electrode 130 is formed to have a thickness greater than 350-400 Å, the second electrode 130 is formed to be opaque, and thus, it cannot output light emitted from the organic light emitting unit 125 to the front surface.

Here, the second electrode 130 is a cathode of the organic light emitting unit 125, and the first electrodes 120R, 120G, and 120B are anodes. When a voltage is applied to the first electrodes 120R, 120G, and 120B and the second electrode 130, electrons are injected from the second electrode 130 to the organic light emitting unit 125 and holes are injected from the first electrodes 120R, 120G, and 120B to the organic light emitting unit 125 to generate excitons in the organic light emitting layer. As the excitons decay, light corresponding to an energy difference of lowest unoccupied molecular orbital (LUMO) and highest occupied molecular orbital (HOMO) of the light emitting layer is generated and emitted to the outside (or toward the first substrate 110 in the drawing). Here, red light, green light, and blue light are emitted from the R, G, and B light emitting layers, and the light beams are mixed to emit white light. The emitted white light is transmitted through respective R, G, and B color filter layers 117R, 117G, and 117B and only light of a color corresponding to a relevant pixel is output.

The passivation layer 160 is formed on the second electrode 130. The passivation layer 160 includes a plurality of layers of a first passivation layer 162, a second passivation layer 164, and a third passivation layer 166. Here, the first passivation layer 162 and the third passivation layer 166 are inorganic passivation layers made of an inorganic material such as SiOx or SiNx, and the second passivation layer 164 is an organic passivation layer 164 made of a polymer-based material.

The first passivation layer 162 and the third passivation layer 166 may be stacked to have a thickness of about a few micrometers. Here, the first passivation layer 162 and the third passivation layer 166 may be formed to have the same thickness or may be formed to have a different thickness. Also, the second passivation layer 164 may be formed to have a thickness of about a few micrometers, preferably, a thickness of about 10 or more micrometers.

The first passivation layer 162 and the third passivation layer 166 made of an inorganic material seal a lower structure to prevent infiltration of moisture into the organic light emitting unit 125. Also, the second passivation layer 164 made of an organic material prevents infiltration of a foreign material to prevent a foreign material from being infiltrated into the organic light emitting unit 125 or a moisture infiltration path from being generated in the inorganic passivation layer by a foreign material.

Among the first, second, and third passivation layers 162, 164, and 166, the first passivation layer 162 is in contact with the second electrode 130. Thus, light emitted from the inorganic light emitting unit 125 is input to the first passivation layer 162 by passing through the second electrode 130, a difference between refractive indices of the second electrode 130 and the first passivation layer 162 is minimized to allow light to be output to upper side of the organic light emitting unit 125. Here, a refractive index of the second electrode 130 is about 0.1 to 0.4, and a refractive index of the first passivation layer 162 in contact with the second electrode 130 is about 1.5 to 2.5.

The second substrate 170 is attached to the passivation layer 160. Here, as the second substrate 120, glass or plastic may be used or protective film or a cover film such as a PS (Polystyrene) film, a PE (Polyethylene) film, a PEN (Polyethylene Naphthalate) film, a PI (Polyimide) film, or the like, may also be used. When the first substrate is made of a material without ductility such as glass, the second substrate 170 may also be made of glass. However, when the organic light emitting display device is fabricated as a flexible display device by forming the first substrate 110 with flexible plastic, preferably, the second substrate 170 may be formed as a protective film or a cover film.

Although not shown, an adhesive is applied to the passivation layer 160 to attach the second substrate 170. Any material having good adhesive strength and good heat resistance and water resistance may be used as the adhesive, or a thermosetting resin such as an epoxy compound, an acrylate compound, or acrylic rubber may also be used. Here, a bonding layer 142 may be coated to have a thickness of about 5 to 100 μm and may be hardened at a temperature of about 80 to 170° C.

As described above, in an embodiment of the present invention, the second electrode 130, that is, the cathode, is made of an alloy of Ag and an alkaline earth metal or an alloy of Ag and a rare earth metal, and in this case, the content of Ag is greater than the content of the alkaline earth metal or the rare earth metal and the second electrode 130 is formed to have a thickness of 200 Å or greater, whereby the cathode can be prevented from being damaged by high temperature heat or plasma particles having high energy even without an additional organic buffer layer made of an organic material between the cathode and the passivation layer 160 in forming the passivation layer 160 on the cathode. Thus, because there is no need to form a high-priced organic buffer layer on the cathode, fabrication costs can be reduced, and because an organic buffer layer formation process is omitted, the process can be simplified and a tack time of the organic light emitting display device can be improved to enhance process efficiency.

Also, in an embodiment of the present invention, because a refractive index of the first passivation layer 162 directly in contact with the cathode is set to be about 1.5 to 2.5 to prevent light emitted from the organic light emitting unit 125 from being refracted from an interface between the cathode and the first passivation layer 152, whereby a degradation of picture quality by refraction of output light can be prevented without an organic buffer layer between the cathode and the passivation layer.

Hereinafter, a method of fabricating an organic light emitting display device having the structure as described above will be described in detail.

FIGS. 4A through 4E illustrates views depicting a method of fabricating an organic light emitting display device according to an embodiment of the present invention.

Figure 4A:
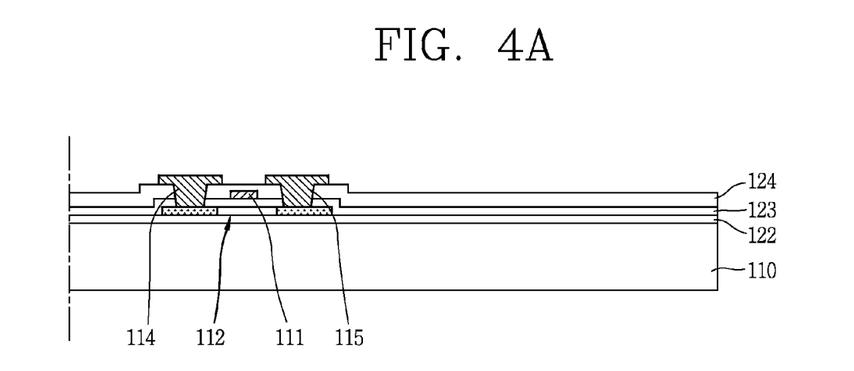
FIGS. 4A through 4E illustrates views depicting a method of fabricating an organic light emitting display device according to an embodiment of the present invention.

First, as shown in FIG. 4A, the first substrate 110 made of a flexible material such as plastic and including a perimeter part and display part, and the buffer layer 122 made of an inorganic material, or the like, is formed on the first substrate 110. Here, a glass substrate may be used as the first substrate 110, and the buffer layer 122 may be formed as a single layer or a plurality of layers.

Thereafter, a transparent oxide, a crystalline silicon, or the like, is stacked on the entire substrate 110 through a CVD method and etched to form the semiconductor layer 112 on the buffer layer 122. Here, a crystalline silicon layer may be formed by stacking crystalline silicon or may be formed by stacking an amorphous silicon and crystallizing an amorphous material according to various crystallization methods such as a laser crystallization method, or the like. A doping layer is formed on both side surfaces of the crystalline silicon layer by doping $n^+$ type or $p^+$ type impurity.

Thereafter, the first insulating layer 123 is formed by stacking an inorganic insulating material such as $SiO_2$ or SiOx on the semiconductor layer 112 by CVD to form the first insulating layer 123, an opaque metal having good conductivity such as Cr, Mo, Ta, Cu, Ti, Al, or an Al alloy is stacked on the first insulating layer 123 according to a sputtering process and etched according to a photolithography process to form the gate electrode 111. Thereafter, the second insulating layer 124 is formed by stacking an inorganic insulating material on the entire substrate 110 on which the gate electrode 111 is formed, according to the CVD method.

Thereafter, the first insulating layer 123 and the second insulating layer 124 are etched to form a contact hole exposing the semiconductor layer, and then, an opaque metal having good conductivity such as Cr, Mo, Ta, Cu, Ti, Al, or an Al alloy is stacked on the entire substrate 110 according to a sputtering method and etched to form the source electrode 114 and the drain electrode 115 electrically connected to the semiconductor layer 112 through a contact hole.

Figure 4B:
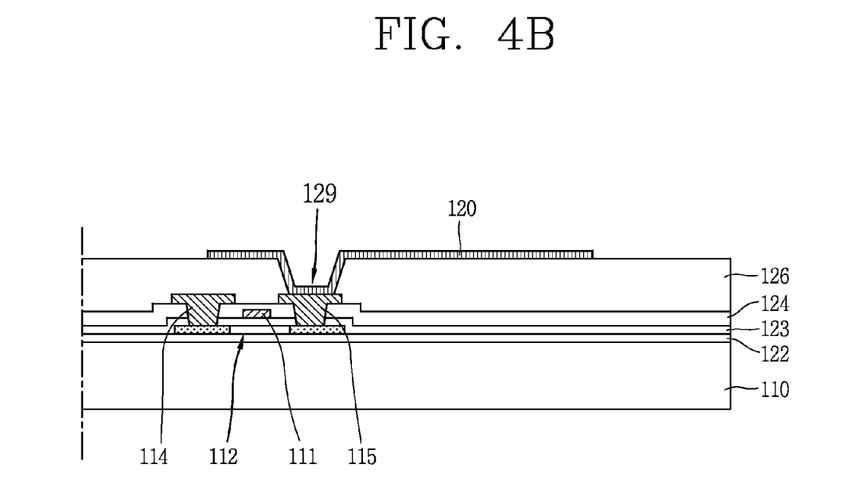

Thereafter, as shown in FIG. 3B, an inorganic insulating material is stacked on the entire substrate 110 on which the source electrode 114, the drain electrode 115, and the pad 117 are formed, to form the third insulating layer 126, and a portion is etched to form the contact hole 129.

Here, the third insulating layer 126 may be formed by stacking $SiO_2$, and the drain electrode 115 of the TFT is exposed to the outside by the contact hole 129.

Thereafter, a metal having good electric conductivity and good reflectance such as Ag, Al, or an Al alloy is stacked according to a sputtering method and etched to form the first electrode 120. Here, the first electrode 120 extends to the inner side of the contact hole 129 and electrically connected to the drain electrode 115 of the driving TFT. Also, the first electrode 120 of the corresponding pixel is electrically insulated from the first electrode 120 of an adjacent pixel.

Figure 4C:
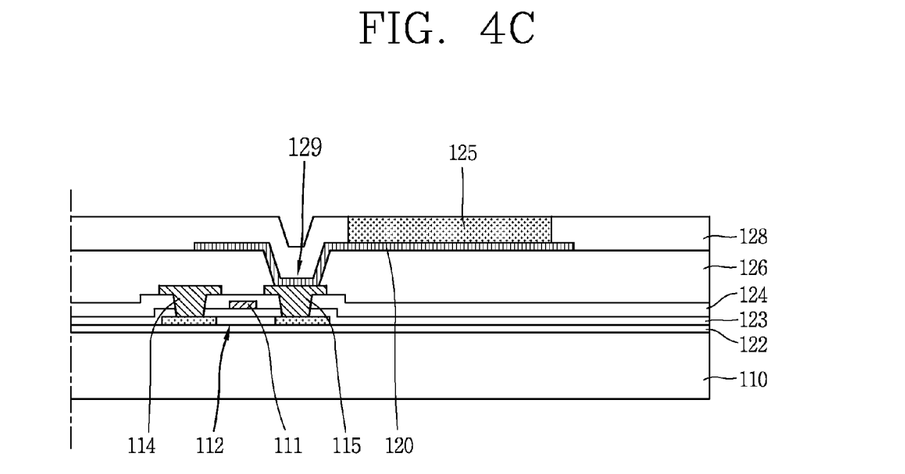

Thereafter, as shown in FIG. 4C, the display part and the bank layer 128 in the periphery region are formed. The bank layer 128 within the display part partitions each pixel to prevent light of a particular color output from adjacent pixels from being mixed and output and fills a portion of the contact hole 129 to reduce a step. Here, the bank layer 128 is formed by stacking an organic insulating material and etching it, or may be formed by stacking an inorganic insulating material according to a CVD method and etching it.

Figure 4D:
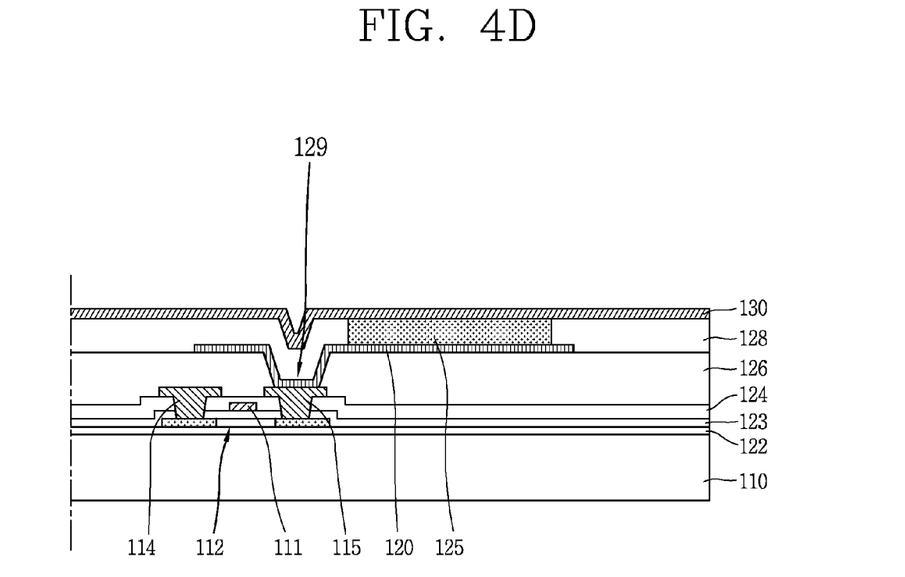

Thereafter, as shown in FIG. 4D, the organic light emitting unit 125 is formed on the entire first substrate 110 on which the bank layer 128 and the first electrode 120 are formed. The organic light emitting unit 125 may include an electrode injection layer, an electrode transport layer, a white organic light emitting layer, a hole transport layer, and a hole injection layer. The white organic light emitting layer may be a layer in which an R-organic light emitting material, a G-organic light emitting material, and a B-organic light emitting material are mixed or may have a structure in which an R-organic light emitting material, a G-organic light emitting material, and a B-organic light emitting material are stacked. The electron injection layer, the electron transport layer, the organic light emitting layer, the hole transport layer, and the hole injection layer may be formed by stacking various materials which are currently used.

Thereafter, an alloy obtained by mixing Ag and an alkaline earth metal in a ratio of (more than 1):1 or an alloy obtained by mixing Ag and a rare earth metal in a ratio of (more than 1):1 is stacked to have a thickness of about 200 Å on the organic light emitting unit 125 according to a sputtering method to form the second electrode 130.

Figure 4E:
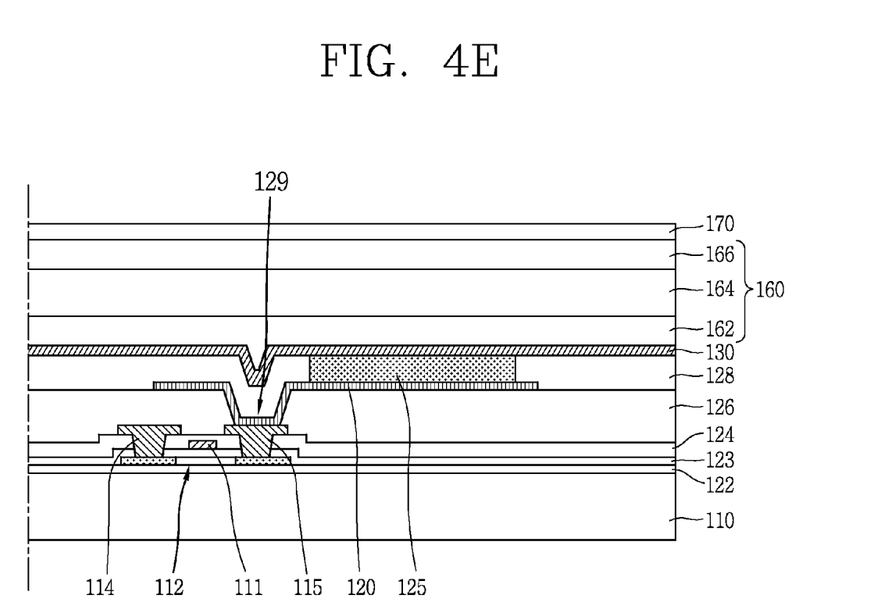

Thereafter, as shown in FIG. 4E, the first passivation layer 162 is formed by stacking an inorganic insulating material such as SiOx or SiNx to have a thickness of about a few micrometers on the second electrode 130 according to a CVD method, or the like. The second passivation layer 164 is formed on the first passivation layer 162 by stacking a polymer-based organic insulating material to have a thickness of about a few micrometer, preferably, about 10 μm. Also, the third passivation layer 166 is formed on the second passivation layer 164 by stacking an inorganic insulating material such as SiOx or SiNx to have a thickness of a few micrometers according to a CVD method, or the like.

Thereafter, the second substrate 170 is positioned on the first substrate 110, and pressure is applied to the first substrate 110 and the second substrate 170 to attach the first substrate 110 and the second substrate 170.

The second substrate 170 may be made of glass or plastic, or may be made of a protective film such as a PS (Polystyrene) film, a PE (Polyethylene) film, a PEN (Polyethylene Naphthalate) film, a PI (Polyimide) film, or the like.

Although not shown, an adhesive such as a thermosetting resin such as an epoxy-based compound, an acrylate compound, or acrylic rubber, a photocuring resin, or the like, may be applied to the third passivation layer 166 to attach the first substrate 110 and the second substrate 170, and thereafter, the adhesive is heated or light is irradiated to harden the adhesive to attach the first substrate 110 and the second substrate 120 to complete an organic light emitting display device.

As described above, in an embodiment of the present invention, the passivation layer can be formed without an additional buffer layer by adjusting an alloy composition ratio and the thickness of the second electrode (that is, a cathode) without changing the structure.

Meanwhile, in the detailed description of the invention above, the organic light emitting display device is disclosed, but the present invention is not limited to the organic light emitting display device having the particular structure. For example, the organic light emitting display device as described above has a structure in which light is output in an upward direction, that is, through the protective film, but the present invention is not limited thereto and may be applied to a structure in which light is output in a downward direction, that is, a substrate. In this case, a transparent conductive material may be used to form the first electrode and an alloy of Ag and alkaline earth metal or an alloy of Ag and a rare earth metal may be used to form the cathode as the second electrode, and the second electrode is formed to have a thickness enough not to allow light emitted from the organic light emitting unit does not transmit the second electrode.

Also, in the detailed description, the driving TFT has a top gate structure, but it may also have a bottom gate structure and TFTs having various structures may be applied.

In other words, in the detailed description, the driving TFT, the electrode, and the organic light emitting unit have particular structures, respectively, but the present invention may be applied to various structures rather than being limited thereto. That is, in an embodiment of the present invention, a structure of every currently known driving TFTs and the structure of the organic light emitting unit may be applied when a buffer layer is removed by forming the cathode of the electrode formed on the organic light emitting unit with an alloy of Ag and an alkaline earth metal or an alloy of Age and a rare earth metal The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An organic light emitting display device comprising:
a first substrate including a plurality of pixel regions;
a thin film transistor (TFT) in each of the pixel regions of a display unit on first substrate;
a first electrode in the pixel region of the display unit;
an organic light emitting unit in the pixel region of the display unit to emit light;
a second electrode on the organic light emitting unit of the display unit;
a passivation layer formed on the second electrode; and
a second substrate on the passivation layer,
wherein the second electrode is made of an alloy of silver (Ag) and an alkaline earth metal or an alloy of silver (Ag) and a rare earth metal, a composition ratio of the silver (Ag) and the alkaline earth metal or the ratio of the silver (Ag) and the rare earth metal is (more than 1):1, and a thickness of the second electrode ranges from 200 Å to 350-400 Å.

2. The organic light emitting display device of claim 1, wherein the passivation layer comprises:
a first passivation layer made of an inorganic material and disposed on the second electrode;
a second passivation layer made of an organic material and disposed on the first passivation layer; and
a third passivation layer made of an inorganic material and disposed on the second passivation layer.

3. The organic light emitting display device of claim 2, wherein the first passivation layer and the second passivation layer are made of $SiN_x$ or $SiO_x$.

4. The organic light emitting display device of claim 2, wherein the first to third passivation layers are formed to have a thickness of a few micrometers, respectively.

5. The organic light emitting display device of claim 2, wherein a refractive index of the second electrode is 0.1 to 0.4, and a refractive index of the first passivation layer is 1.5 to 2.5.

6. The organic light emitting display device of claim 1, wherein the second electrode has a transmittance of 25% or greater at a wavelength of 460 nm, 20% or greater at a wavelength of 530 nm, and 15% or greater at a wavelength of 620 nm.

7. The organic light emitting display device of claim 1, wherein the first electrode is made of a material selected from the group consisting of silver (Ag), aluminum (Al), and an Al alloy.

8. The organic light emitting display device of claim 1, wherein the first substrate is made of glass or plastic.

9. The organic light emitting display device of claim 1, wherein the second substrate is made of glass, plastic or a protective film.

10. A method of fabricating an organic light emitting display device, the method comprising:
providing a first substrate and a second substrate;
forming a thin film transistor (TFT) at each pixel of the first substrate;
forming a first electrode in each pixel;
forming an organic light emitting unit for emitting light on the first electrode;
forming a second electrode by depositing an alloy of silver (Ag) and an alkaline earth metal or an alloy of silver (Ag) and a rare earth metal having a composition ratio of (more than 1):1 and having a thickness ranging from 200 Å to 350-400 Å;
forming a passivation layer on the second electrode; and
attaching the first substrate and the second substrate.

11. The method of claim 10, wherein the forming of the passivation layer comprises:
forming a first passivation layer by depositing an inorganic material on the second electrode;
forming a second passivation layer by depositing an organic material on the first passivation layer; and
forming a third passivation layer by depositing an inorganic material on the second passivation layer.

12. An organic light emitting display device comprising:
a first substrate including a plurality of pixel regions;

a thin film transistor (TFT) at each of the plurality of pixel regions of a display unit of the substrate;

a first electrode formed in the pixel region of the display unit;

an organic light emitting unit in the pixel region of the display unit to emit light;

a second electrode on the organic light emitting unit of the display unit and made of an alloy of silver (Ag) and an alkaline earth metal or an alloy of silver (Ag) and a rare earth metal;

a passivation layer on the second electrode; and a second substrate on the passivation layer, wherein the passivation layer includes a first inorganic passivation layer made of an inorganic material and disposed to be in contact with the second electrode, and a refractive index of the second electrode is 0.1 to 0.4 and a refractive index of the first inorganic passivation layer in contact with the second electrode is 1.5 to 2.5.

13. The organic light emitting display device of claim 12, wherein the passivation layer further includes at least one organic passivation layer and a second inorganic passivation layer formed on the inorganic passivation layer.

* * * * *